United States Patent [19]

Davies et al.

[11] Patent Number: 4,929,911
[45] Date of Patent: May 29, 1990

[54] PUSH-PULL OUTPUT CIRCUIT HAVING THREE TRANSISTORS

[75] Inventors: Thomas J. Davies; Evert Seevinck, both of Eindhoven, Netherlands; Leonardus C. M. G. Pfennings, deceased, late of Sittard; Henricus J. Kennen, Valkenswaard, both of Netherlands, legal representative; Peter H. Voss, Eindhoven; Cormac M. O'Connell, Eindhoven; Cathal G. Phelan, Eindhoven; Hans Ontrop, Eindhoven, all of Netherlands

[73] Assignee: U.S. Philips Corp., New York, N.Y.

[21] Appl. No.: 296,462

[22] Filed: May 22, 1989

[30] Foreign Application Priority Data

Jan. 14, 1988 [NL] Netherlands ........................ 8800075

[51] Int. Cl.$^5$ .............................................. H03F 3/26

[52] U.S. Cl. .................................... 330/264; 330/269
[58] Field of Search ............... 330/262, 263, 264, 269, 330/270, 271, 273, 307; 307/448, 451

[56] References Cited

U.S. PATENT DOCUMENTS 4,096,398  6/1978  Khaitan .......................... 330/269 X
4,810,969  3/1989  Fulkerson .......................... 307/448

Primary Examiner—Steven Mottola
Attorney, Agent, or Firm—Steven R. Biren

[57] ABSTRACT

A push-pull output circuit which is powered by a 5-V supply voltage and in which the "push" part comprises a PMOS transistor and the "pull" comprises a PMOS transistor and an NMOS transistor. The NMOS transistor is driven via a detection circuit so that no hot carrier stress occurs in the NMOS transistor.

5 Claims, 1 Drawing Sheet

PUSH-PULL OUTPUT CIRCUIT HAVING THREE TRANSISTORS

BACKGROUND OF THE INVENTION

The invention relates to a push-pull output circuit in which current channels of a first and a second output transistor are connected between a first power supply terminal and an output terminal and between the output terminal and a second power supply terminal, respectively, the first output transistor being a p-type transistor, a first and a second input terminal being coupled to a control electrode of the first and the second output transistor, respectively, which input terminals receive a logic input signal and the inverse thereof, respectively.

A circuit of the kind set forth is known from European Patent Specification No. 0 171 266, which describes a push-pull output circuit in which the output transistors are of mutually different conductivity types. In the case of a voltage difference which exceeds a value $U_{STRESS}$ across the main electrodes of an n-type transistor, a substantial risk of so-called hot carrier stress arises because of the resultant field strength near the first main electrode. As the lengths of the current channels decrease, the value $U_{STRESS}$, being the maximum voltage to prevent hot carrier stress in n-type transistors, also decreases. The value $U_{STRESS}$ depends not only on the length of the current channel but also on the steepness of the doping profiles of the implanted regions forming the input and output regions of a transistor, steeper doping profiles implying a reduction of the value $U_{STRESS}$.

In integrated circuits in which channel lengths of transistors amount to approximately 1 µm or less than 1 µm (sub-micron), the doping profiles of the input and output regions of transistors are steep in order to enable still the realization of current channels between the input and output regions. In an integrated circuit in which mainly submicron transistors are implemented preferably the same process technology is used for the realization of transistors having channel lengths greater than 1 µm, so that additional process steps or separate masks which usually have a cost-increasing effect can be dispensed with. For transistors having channel lengths in excess of 1 µm this means that the input and output regions also have steep doping profiles, implying a small value $U_{STRESS}$.

The circuit described in the cited Patent Specification has the drawback that hot carrier stress can occur in n-type transistors in the case of channel lengths which are approximately equal to or smaller than 1 µm, but also in n-type transistors produced in a submicron process without additional steps or operations with channel lengths in excess of 1 µm when a standard supply voltage of, for example 5 V is used. Decreasing the supply voltage of the said circuit to, for example 3.3 V would preclude hot carrier stress, but would also lead to a switching speed of the output circuit which is lower than desirable.

SUMMARY OF THE INVENTION

It is an object of the invention to provide an output circuit in which the risk of hot carrier stress is minimum, despite the use of short channel lengths (approximately 1 µm) in the output transistors, even when the circuit operates with a customary standard power supply voltage (for example 5 V). It is a further object of the invention to enable the output circuit to drive transistor-transistor logic (TTL) as well as complementary-MOS (CMOS) logic.

To achieve this, a push-pull output circuit in accordance with the invention is characterized in that the second output transistor is also a p-type transistor and in that parallel to the current channel of the second output transistor there is connected a current channel of a third output transistor of the n-type, detection means being connected to the output terminal for turning on the third output transistor when the voltage on the output terminal drops below the predetermined voltage level.

A push-pull output circuit in accordance with the invention offers the advantage that said hot carrier stress does not occur, because the maximum permissible voltage $U_{STRESS}$ is not exceeded; this is because p-type transistors are not as susceptible to hot carrier stress as n-type transistors since the mobility of holes in p-type transistors is less than that of electrons in n-type transistors and, moreover, said circuit has a higher switching speed than circuits powered by a supply voltage which is lower than usual, for example 3.3 V. The n-type output transistor is not conductive when a voltage difference across the main electrodes is larger than the value $U_{STRESS}$; it is only in the case of a voltage difference which is smaller than the value $U_{STRESS}$ that the n-type transistor is turned on or not, depending on the input signals.

An embodiment of a push-pull output circuit in accordance with the invention is characterized in that the detection means comprise a p-type detection transistor, whose first main electrode is connected to the first power supply terminal, its control electrode being connected to the output terminal and its second main electrode being connected to the control electrode of the third transistor. Said detection transistor detects the voltage on the output terminal and turns on the third transistor as soon as the voltage on the output terminal has decreased to the voltage on the first power supply terminal minus the threshold voltage of the detection transistor, at which voltage the third transistor no longer experiences hot carrier stress. When the third transistor still experiences hot carrier stress when the voltage on the output terminal is equal to the voltage on the first power supply terminal minus the threshold voltage of the detection transistor, for example because of a high supply voltage or because of a transistor with an associated low value $U_{STRESS}$, one or more transistors can be connected as a diode between the first main electrode of the detection transistor and the first power supply terminal, so that the third transistor is turned on only after the voltage on the output terminal has decreased to the voltage on the first power supply terminal minus the threshold voltage of the detection transistor minus the threshold voltage (threshold voltages) of the transistor (transistors) connected as a diode.

Another embodiment of a push-pull output circuit in accordance with the invention is characterized in that between the first main electrode of the detection transistor and the first power supply terminal there is connected the current channel of a fourth transistor of the p-type whose control electrode is coupled to the first input terminal, between the second main electrode of the detection transistor and the second power supply terminal there being connected the current channel of a fifth transistor of the n-type whose control electrode is coupled to the first input terminal. During a signal transition on the first and the second input terminal from logic low to logic high and from logic high to logic low, respectively, said fourth and fifth transistor quickly turn off the third transistor in order to ensure that during the signal transition on the first and the second input terminal no short circuit current can flow from the first to the second power supply terminal via the first and the third transistor,

BRIEF DESCRIPTION OF THE DRAWINGS

Embodiments in accordance with the invention will be described in detail hereinafter, by way of example, with reference to the drawing, in which.

DESCRIPTION OF THE PREFERRED EMBODIMENTS

Figure 1:
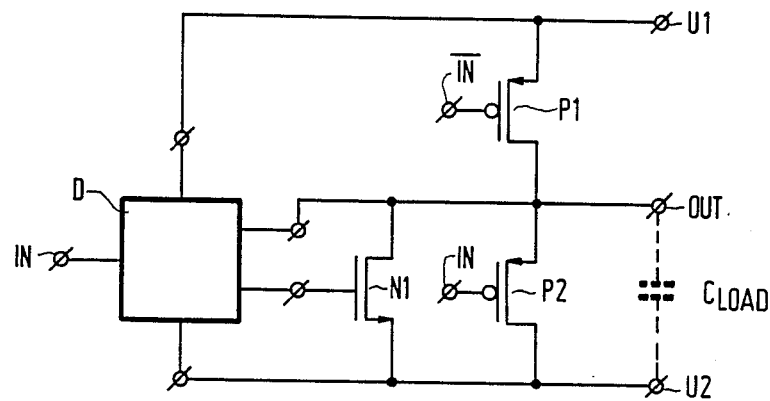
FIG. 1 shows an embodiment of a push-pull output circuit in accordance with the invention.

FIG. 1 shows an embodiment of a push-pull output circuit in accordance with the invention, comprising a first and a second PMOS transistor P1 and P2, respectively, a third NMOS transistor N1, and a subcircuit D The drain and the source, respectively, of the transistors P1 and P2, respectively, are connected to an output terminal OUT, to the drain of the transistor N1 and also to a first connection terminal of the subcircuit D. The drain and the source, respectively, of the transistor P2 and the transistor N1, respectively, are connected to the second power supply terminal U2 and to a second connection terminal of the subcircuit D. The source of the transistor P1 is connected to the first supply terminal U1 and to a third connection terminal of the subcircuit D. The fourth and the fifth connection terminal of the subcircuit D are coupled to the gate of the third transistor N1 and to a first input terminal IN, respectively. The control electrodes of the transistor P1 and the transistor P2 are coupled to the second input terminal $\overline{IN}$ and the first input terminal IN, respectively. A capacitive load $C_{LOAD}$ can be connected between the output terminal OUT and the second supply terminal U2.

The circuit shown in FIG. 1 operates as follows: the subcircuit D comprises detection means for the detection of the voltage level on the output terminal OUT and for turning on the transistor N1 when the voltage on the output terminal OUT drops below a predetermined voltage level $U_{STRESS}$. In the case of a logic high input signal IN, the transistor P1 will be turned on and the transistors P2 and N1 will be turned off. Because of the charging of the capacitive load $C_{LOAD}$, the voltage on the output terminal OUT becomes logic high. In the case of a logic low input signal IN, the transistor P1 will be turned off and the transistor P2 will be turned on. The transistor N1 remains turned off for the time being. The voltage on the output terminal OUT will decrease due to the turned-on state of the transistor P2. Because of its turned-off state, the transistor N1 will not experience hot carrier stress. After the voltage on the output terminal OUT has decreased to a value below $U_{STRESS}$, below which value the transistor N1 will no longer experience hot carrier stress in its turned-on state, the transistor N1 will be turned on via the subcircuit D, so that the output load capacitance $C_{LOAD}$ is discharged via the transistors P2 and N1. Below a voltage on the output terminal OUT which amounts to the sum of the threshold voltage $V_{THP2}$ and the voltage on the input terminal IN, where $V_{THP2}$ is the threshold voltage of the transistor P2, the transistor P2 will be turned off.

The transistor N1, however, remains turned on so that the capacitive load $C_{LOAD}$ is fully discharged.

Figure 2:
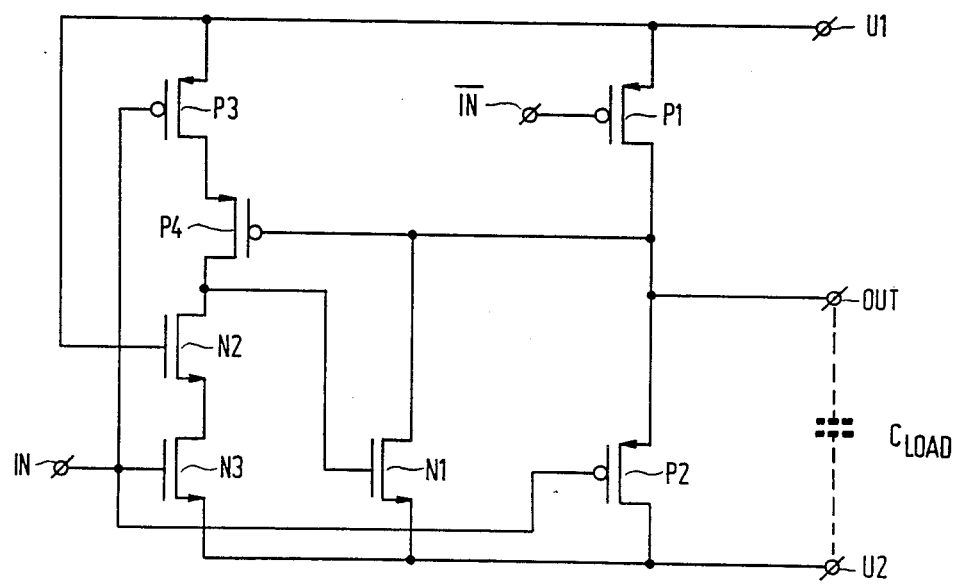
FIG. 2 shows a preferred embodiment of a push-pull output circuit in accordance with the invention.

FIG. 2 shows a preferred embodiment of a push-pull output circuit in accordance with the invention which corresponds to that shown in FIG. 1, so that corresponding reference symbols are used to denote corresponding parts. The subcircuit D is now composed of two NMOS transistors N2 and N3 and two PMOS transistors P3 and P4. The source of the transistor P3 is connected to the first power supply terminal U1 and to the control electrode of the transistor N2. The source and the drain of the transistor P4 are coupled to the drain of the transistor P3 and the drain of the transistor N2, respectively. The source of the transistor N2 is connected to the drain of the transistor N3 and the source of the transistor N3 is coupled to the second supply supply terminal U2. The control electrodes of the transistors P3 and N3 are connected to the first input terminal IN, the control electrode of the transistor N1 being connected to the drains of the transistors P4 and N2. The control electrode of the transistor P4 is connected to the output terminal OUT.

The operation of the circuit shown in FIG. 2 is as follows: in the case of a logic high input signal on the first input terminal IN, the transistor N3 will be turned on and the transistors P2 and P3 will be turned off; because of a logic low input signal $\overline{IN}$ on the control electrode of the transistor P1, the transistor P1 will be turned off. The transistor N2 will be turned on, so that the control electrode of the transistor N1 receives a low voltage and hence the transistor N1 is turned off. The output load capacitance $C_{LOAD}$ is charged via the transistor P1.

When the signal on the first and the second input terminal changes from logic high to logic low and from logic low to logic high, respectively, the transistor P1 will be turned off and the transistor P2 will be turned on. The transistor P4 is turned off because the voltage difference between the control electrode and the source of the transistor P4 is smaller than the threshold voltage $V_{THP4}$ of the transistor P4, so that the transistor N1 also remains turned off. The voltage on the output load capacitance $C_{LOAD}$ will decrease due to the turned-on state of the transistor P2. When the latter voltage decreases to $U1-V_{THP4}$, where $V_{THP4}$ is the threshold voltage of the transistor P4, the transistor P4 will be turned on, so that the control electrode of the transistor N1 receives a high signal and the transistor N1 is turned on. Consequently, the output voltage $V_{OUT}$ will decrease faster. As soon as the voltage on the output terminal OUT has decreased to a value $V_{IN}+V_{THP2}$, where $V_{THP2}$ is the threshold voltage of the transistor P2, the transistor P2 will be turned off. The transistor N1, however, will remain turned on, so that the output load capacitance $C_{LOAD}$ is fully discharged. The transistor N2 serves to protect the transistor N3 in order to ensure that the voltage on the drain of the transistor N3 cannot exceed the voltage on the first supply terminal U1 minus the threshold voltage $V_{THN2}$ of the transistor N2, so that no hot carrier tress occurs in the transistor N3. It is to be noted that PMOS transistors are less susceptible to hot carrier stress than NMOS transistors, because of the fact that the mobility of holes in PMOS transistors is less than that of electrons in NMOS transistors. To those skilled in the art it will be apparent that the subcircuit D can also be composed by means of other components, for example a subcircuit as shown in FIG. 2 in which, however, the transistors N2 and N3 are replaced by a resistor. However, on the one hand a desirable low stationary power dissipation then implies a higher resistance, while on the other hand in view of a desirable short RC discharging time a low resistance value is required for a fast discharge of the control electrode-source capacitance of the transistor N1 when the signal on the first input terminal changes from logic high to logic low.

A push-pull output circuit in accordance with the invention is suitable for driving TTL as well as CMOS logic when suitable values are chosen for the dimensions of the transistors P1, P2 and N2. For TTL drivers (where the load resistance to the first supply terminal is approximately twice the load resistance to the second supply terminal) the output circuit should deliver a logic high level and a logic low level of at least 2.4 V and at the most 0.4 V, respectively. In the case of a 5-V supply voltage a suitable choice of the width/length ratios W/L of an output circuit comprising MOS transistors is 200/1.2, 300/1,2 abd 499.1.1 for the transistors P1, P2 and N2, respectively.

What is claimed is:

1. A push-pull output circuit comprising first and second output transistors, in which current channels of the first and second output transistors are connected between a first power supply terminal and an output terminal and between the output terminal and a second power supply terminal, respectively, the first output transistor being a p-type transistor, a first and a second output terminal being coupled to a control electrode of the first and the second output transistor, respectively, which input terminals receive a logic input signal and the inverse thereof, respectively, characterized in that the second output transistor is also a p-type transistor and in that a third output transistor of the n-type is provided, the current channel of said third transistor being connected directly in parallel with the current channel of the second output transistor, and in that detection means for turning on the third output transistor when the voltage on the output terminal drops below the predetermined voltage level are coupled to said third transistor.

2. A push-pull output circuit as claimed in claim 1, characterized in that the detection means comprise a p-type detection transistor whose first main electrode is connected to the first power supply terminal, its control electrode being connected to the output terminal, and its second main electrode being connected to the control electrode of the third transistor.

3. A push-pull output circuit as claimed in claim 2, further comprising a fourth, p-type transistor, characterized in that between the first main electrode of the detection transistor and the first power supply terminal there is connected the current channel of said fourth transistor of the p-type whose control electrode is coupled to the first input terminal, and a fifth, n-type transistor, between the second main electrode of the detection transistor and the second power supply terminal there being connected the current channel of said fifth transistor of the n-type whose control electrode is coupled to the first input terminal.

4. A push-pull output circuit as claimed in claim 3, further comprising a sixth, n-type transistor, characterized in that between the second main electrode of the detection transistor and the first main electrode of the fifth transistor there is connected the current channel of said sixth transistor of the n-type whose control electrode is coupled to the first power supply terminal.

5. A push-pull output circuit as claimed in claim 1, 2, 3 or 4, characterized in that said n-type transistors are one of an n-channel field effect transistor and an npn transistor, and said p-type transistors are one of a p-channel field effect transistor and a pnp transistor.

* * * * *